(12) United States Patent
Wei et al.

(10) Patent No.: US 8,339,835 B2
(45) Date of Patent: Dec. 25, 2012

(54) NONVOLATILE MEMORY ELEMENT AND SEMICONDUCTOR MEMORY DEVICE INCLUDING NONVOLATILE MEMORY ELEMENT

(75) Inventors: Zhiqiang Wei, Osaka (JP); Takeshi Takagi, Kyoto (JP); Mitsuteru Iijima, Osaka (JP)

(73) Assignee: Panasonic Corporation, Osaka (JP)

( * ) Notice: Subject to any disclaimer, the term of this patent is extended or adjusted under 35 U.S.C. 154(b) by 137 days.

(21) Appl. No.: 13/000,243

(22) PCT Filed: Apr. 22, 2010

(86) PCT No.: PCT/JP2010/002896
§ 371 (c)(1),
(2), (4) Date: Dec. 20, 2010

(87) PCT Pub. No.: WO2010/140296
PCT Pub. Date: Dec. 9, 2010

(65) Prior Publication Data
US 2011/0103132 A1     May 5, 2011

(30) Foreign Application Priority Data
Jun. 3, 2009    (JP) ................................. 2009-133923

(51) Int. Cl.
  *G11C 11/00*    (2006.01)
(52) U.S. Cl. .......... 365/148; 365/51; 365/163; 365/203; 365/225.7

(58) Field of Classification Search .................. 365/148, 365/163, 203, 51
See application file for complete search history.

(56) References Cited

U.S. PATENT DOCUMENTS

| 5,737,259 | A * | 4/1998 | Chang ............................ 365/105 |
| 5,920,499 | A * | 7/1999 | Chang ............................ 365/105 |
| 5,962,900 | A * | 10/1999 | Chou et al. ..................... 257/368 |
| 6,731,535 | B1 | 5/2004 | Ooishi et al. |
| 7,068,534 | B2 * | 6/2006 | Bedeschi et al. .............. 365/163 |
| 2003/0002338 | A1 * | 1/2003 | Xu et al. .................. 365/185.11 |
| 2006/0157679 | A1 | 7/2006 | Scheuerlein |
| 2008/0130352 | A1 | 6/2008 | Scheuerlein |
| 2011/0002155 | A1 * | 1/2011 | Arita et al. ..................... 365/148 |

FOREIGN PATENT DOCUMENTS

| JP | 2004-193282 | 7/2004 |
| JP | 2006-203098 | 8/2006 |
| JP | 2008-527613 | 7/2008 |

* cited by examiner

*Primary Examiner* — Pho M Luu
(74) *Attorney, Agent, or Firm* — McDermott Will & Emery LLP

(57) ABSTRACT

A nonvolatile memory element includes a current controlling element having a non-linear current-voltage characteristic, a resistance variable element which changes reversibly between a low-resistance state and a high-resistance state in which a resistance value of the resistance variable element is higher than a resistance value of the resistance variable element in the low-resistance state, in response to voltage pulses applied, and a fuse. The current controlling element, the resistance variable element and the fuse are connected in series, and the fuse is configured to be blown when the current controlling element is substantially short-circuited.

9 Claims, 13 Drawing Sheets

(a)

(b)

(a)

(b)

(a)

101   100

(b)

104
103a
102
101   100

(c)

103a
102
101   100

(m)

(n)

NONVOLATILE MEMORY ELEMENT AND SEMICONDUCTOR MEMORY DEVICE INCLUDING NONVOLATILE MEMORY ELEMENT

RELATED APPLICATIONS

This application is the U.S. National Phase under 35 U.S.C. §371 of International Application No. PCT/JP2010/002896, filed on Apr. 22, 2010, which in turn claims the benefit of Japanese Application No. 2009-133923, filed on Jun. 3, 2009, the disclosures of which Applications are incorporated by reference herein.

TECHNICAL FIELD

The present invention relates to a nonvolatile memory element and a semiconductor memory device including the nonvolatile memory element. Particularly, the present invention relates to a nonvolatile memory element and a semiconductor memory device including a resistance variable element which changes reversibly between a low-resistance state and a high-resistance state in which a resistance value of the resistance variable element is higher than a resistance value of the resistance variable element in the low-resistance state, by application of voltage pulses.

BACKGROUND ART

With recent advancement of digital technologies, electronic hardware such as portable information devices and information home appliances has been developed to provide higher functionality. As the electronic hardware has been developed to provide higher functionality, development of miniaturized and higher-speed semiconductor elements incorporated into the electronic hardware is progressing at a high pace. Among them, the use of a large-capacity nonvolatile memory which is represented by a flash memory has been spreading at a rapid pace. Furthermore, as a next-generation new nonvolatile memory which has a potential to replace the flash memory, a resistance variable semiconductor memory device (ReRAM) including a so-called resistance variable element has been researched and developed. As defined herein, the resistance variable element refers to an element which has a characteristic in which its resistance values change reversibly in response to electric signals and is able to store information corresponding to the resistance values in a nonvolatile manner. Unlike a phase change random access memory (PCRAM) which is adapted to change its resistance values due to a fact that a change of a crystalline state is induced by heat generated by electric stresses applied thereto, the resistance variable element changes its resistance values by changing redox states of a resistance variable material, directly in response to the electric stresses applied thereto, i.e., by migration of electrons.

As an example of a large-capacity semiconductor memory device incorporating the resistance variable element, a cross-point semiconductor memory device has been known. In the cross-point ReRAM, a nonvolatile memory element (also referred to as memory cell) is configured to incorporate as a current controlling element, a diode connected in series with a resistance variable element provided at a cross-point where a word line three-dimensionally crosses a bit line, to avoid reading of a resistance value from a certain resistance variable element from being affected by another memory elements belonging to another rows or columns (e.g., see patent literature 1).

FIG. 13 is a view showing a semiconductor memory device incorporating a memory cell including a conventional resistance variable element and a current controlling element. As shown in FIG. 13, in a cross-point memory cell array including bit lines 210, word lines 220 and memory cells 280 formed at cross-points of the bit lines 210 and the word lines 220, each memory cell 280 is configured by connecting a resistance variable element 260 adapted to store data by an change in its electric resistances due to electric stresses in series with a two-terminal current controlling element 270 having a non-linear current-voltage characteristic in which the current controlling element 270 is capable of flowing a current bidirectionally. The bit line 210 which serves as an upper wire is electrically connected to the current controlling element 270. The word line 220 which serves as a lower wire is electrically connected to the resistance variable element 260. Since a current flows bidirectionally through the current controlling element 270 when data is rewritten in the memory cell 280, a larger capacity is attainable by using, for example, a current controlling element (varistor or the like) having a current-voltage characteristic which is symmetric bidirectionally (both of positive voltage side and negative voltage side) and is non-linear.

CITATION LIST

Patent Literature

Patent literature 1: Japanese Laid-Open Patent Application Publication No. 2006-203098

SUMMARY OF THE INVENTION

Technical Problem

However, in the cross-point memory cell array including the current controlling element disclosed in patent literature 1, a high current flows through the resistance variable element and the current controlling element by a voltage pulse applied to the nonvolatile memory element (memory cell), the nonvolatile memory element is electrically broken down and substantially short-circuited, causing a failure in the nonvolatile memory element. When a failure occurs in a certain nonvolatile memory element, the nonvolatile memory element is substantially short-circuited (state where its resistance value is very low), so that entire part of a current flowed to access another nonvolatile memory elements belonging to the same row or column as that to which the nonvolatile memory element in a failed state belongs, flows through the nonvolatile memory element in the failed state which is substantially short-circuited. As a result, data cannot be written to and read from all of another nonvolatile memory elements belonging to the same row or column as that to which the nonvolatile memory element in the failed state belongs.

The present invention is directed to solving the above mentioned problem, and an object of the present invention is to provide a nonvolatile memory element which can effectively avoid an event that when a failure occurs in a certain nonvolatile memory element, data cannot be written to and read from another nonvolatile memory element belonging to the same column or row as that to which the nonvolatile memory element in a failed state belongs, and a semiconductor memory device including the nonvolatile memory element.

Solution to Problem

To achieve the above object, a nonvolatile memory element of the present invention comprises a current controlling element having a non-linear current-voltage characteristic; a resistance variable element which changes reversibly between a low-resistance state and a high-resistance state in which a resistance value of the resistance variable element is higher than a resistance value of the resistance variable element in the low-resistance state, in response to voltage pulses applied; and a fuse; the current controlling element, the resistance variable element and the fuse being connected in series, and the fuse being configured to be blown when the current controlling element or the resistance variable element is substantially short-circuited.

In accordance with this structure, when a failure occurs in a resistance variable element or a current controlling element constituting a certain nonvolatile memory element and the nonvolatile memory element is substantially short-circuited, a current flowing through the resistance variable element increases, causing the resistance variable element to be placed in a resistance state lower than the low-resistance state. As a result, a most part of the voltage applied to the nonvolatile memory element is applied to the fuse. Since the voltage applied to that nonvolatile memory element is applied to the fuse, a high current flows through the fuse, which is thereby blown. For this reason, the nonvolatile memory element in a failed state is caused to have a resistance value which is not lower than a resistance value of the resistance variable element in the high-resistance state. When a current is flowed through the same row or column as that to which the nonvolatile memory element in the failed state belongs, the current is prevented from flowing through the nonvolatile memory element in the failed state, while the current flows, via its adjacent row or column, to another nonvolatile memory element belonging to the same row or column as that to which the nonvolatile memory element in the failed state belongs. Therefore, another nonvolatile memory element is accessible and can perform a normal operation. Thus, even when a failure occurs in a certain nonvolatile memory element, it is possible to effectively avoid an event that data cannot be written to and read from another nonvolatile memory element belonging to the same row or column as that to which the nonvolatile memory element in the failed state belongs.

The current controlling element, the resistance variable element and the fuse may be provided at a three-dimensional cross-point at which a first wire crosses a second wire, to constitute a cross-point nonvolatile memory element.

The fuse is provided for each cross-point nonvolatile memory element in the nonvolatile memory element array including the above described nonvolatile memory elements. Therefore, if a failure occurs in a nonvolatile memory element, a fuse connected to the nonvolatile memory element in the failed state is blown, thereby preventing a high current from flowing through the nonvolatile memory element in the failed state. In addition, the current flows, via its adjacent row or column, to another nonvolatile memory element belonging to the same row or column as that to which the nonvolatile memory element in the failed state belongs. Therefore, another nonvolatile memory element is accessible and can perform a normal operation.

The fuse may have a resistance value lower than the resistance value of the nonvolatile memory element in the low-resistance state, before the fuse is blown.

By connecting a resistor (fuse) having the above resistance value in series with the resistance variable element and the current controlling element, a current flowing through the resistance variable element when the resistance variable element changes to the low-resistance state can be restricted, and thus, insulation breakdown of the resistance variable element can be prevented effectively. In accordance with the above configuration, therefore, since the fuse is operative as the series resistor for controlling a current when the resistance variable element is in the low-resistance state, the series resistor need not be provided separately. Thus, the nonvolatile memory element can achieve a normal operation stably, without increasing a manufacturing cost.

Preferably, the fuse may have the resistance value of 5 kΩ or less.

The fuse may comprise polysilicon.

Thereby, the fuse can be manufactured inexpensively and easily. Since the resistance value of the fuse can be varied easily by varying an amount of impurities with which polysilicon is doped, it is possible to manufacture an optimal fuse according to specification and the like. Alternatively, polysilicon may be produced into a silicide.

A semiconductor memory device of the present invention comprises a substrate; a plurality of first wires provided on the substrate to extend in parallel with each other; a plurality of second wires provided above the plurality of first wires to extend in parallel with each other within a plane parallel to a main surface of the substrate and three-dimensionally cross the plurality of first wires; and a nonvolatile memory element array including a plurality of nonvolatile memory elements each of which is recited in Claim 1, the nonvolatile memory elements being provided to respectively correspond to three-dimensional cross-points of the plurality of first wires and the plurality of second wires and to connect the first wires to the second wires.

In accordance with this structure, when a failure occurs in a certain nonvolatile memory element and the nonvolatile memory element is substantially short-circuited, a current flowing through the resistance variable element increases, causing the resistance variable element placed in a resistance state lower than a low-resistance state. As a result, most part of the voltage applied to the nonvolatile memory element is applied to the fuse. Since the voltage to be applied to the nonvolatile memory element is applied to the fuse, a high current flows through the fuse, which is thereby blown. For this reason, the nonvolatile memory element in the failed state is caused to have a resistance value which is not lower than a resistance value of the resistance variable element in the high-resistance state. When a current is flowed through the same row or column as that to which the nonvolatile memory element in a failed state belongs, the current is prevented from flowing through the nonvolatile memory element in the failed state, while the current flows, via its adjacent row or column, to another nonvolatile memory element belonging to the same row or column as that to which the nonvolatile memory element in the failed state belongs. Therefore, another nonvolatile memory element is accessible and can perform a normal operation. Thus, even when a failure occurs in a certain nonvolatile memory element, among nonvolatile memory elements each including a resistance variable element which changes reversibly between a low-resistance state and a high-resistance state in which the resistance value of the resistance variable element is higher than the resistance value of the resistance variable element in the low-resistance state by applying voltage pulses, it is possible to effectively avoid an event that data cannot be written to and read from another nonvolatile memory element belonging to the same row or column as that to which the nonvolatile memory element in the failed state belongs.

The resistance variable element may include a first electrode, a second electrode and a resistance variable layer sandwiched between the first electrode and the second electrode. The current controlling element may include a third electrode, a fourth electrode, and an insulator layer or a semiconductor layer which is sandwiched between the third electrode and the fourth electrode. The nonvolatile memory element may include at least one of a contact plug provided between the first wire and the first electrode of the resistance variable element to electrically connect the first wire to the first electrode, a contact plug provided between the second electrode of the resistance variable element and the third electrode of the current controlling element to electrically connect the second electrode to the third electrode, and a contact plug provided between the fourth electrode of the current controlling element and the second wire to electrically connect the fourth electrode to the second wire. The fuse may be configured as one of the contact plugs.

In accordance with this configuration, since a fuse layer need not be provided separately, manufacturing process steps of the semiconductor memory device does not increase in number.

The "fuse" recited in claims and description refers to a element which is blown and fused when a current with a predetermined current value or more flows therethrough.

The phrase "the nonvolatile memory element is substantially short-circuited" in claims and description means a state where the nonvolatile memory element has a resistance value which is lower than a resistance value of the nonvolatile memory element in a normal low-resistance state due to electric breakdown.

The above object, other objects, features, and advantages of the present invention will be apparent by the following detailed description of preferred embodiments of the inventions, with reference to the accompanying drawings.

Advantageous Effect of the Invention

In accordance with a nonvolatile memory element and a semiconductor memory device of the present invention, since the current controlling element, the resistance variable element and the fuse are connected in series, it is possible to effectively avoid an event that when a failure occurs in a certain nonvolatile memory element, data cannot be written to and read from another nonvolatile memory element belonging to the same column or row as that to which the nonvolatile memory element in a failed state belongs.

DESCRIPTION OF EMBODIMENTS

Figure 1:
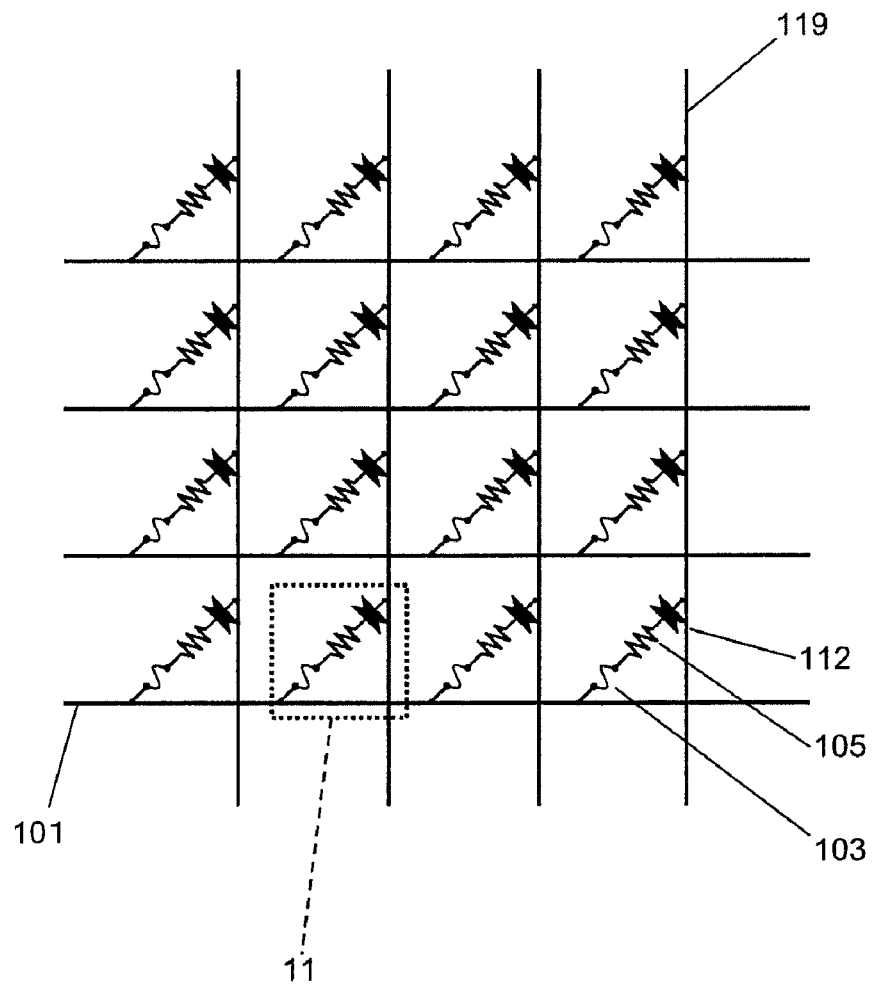
FIG. 1 is a schematic circuit diagram showing a semiconductor memory device according to Embodiment 1 of the present invention.

Hereinafter, embodiments of the present invention will be described in detail with reference to the drawings. Throughout the drawings, the same or corresponding constituents are designated by the same reference numerals and will not be described repetitively in some cases.

Embodiment 1

Schematic Configuration

Figure 2:
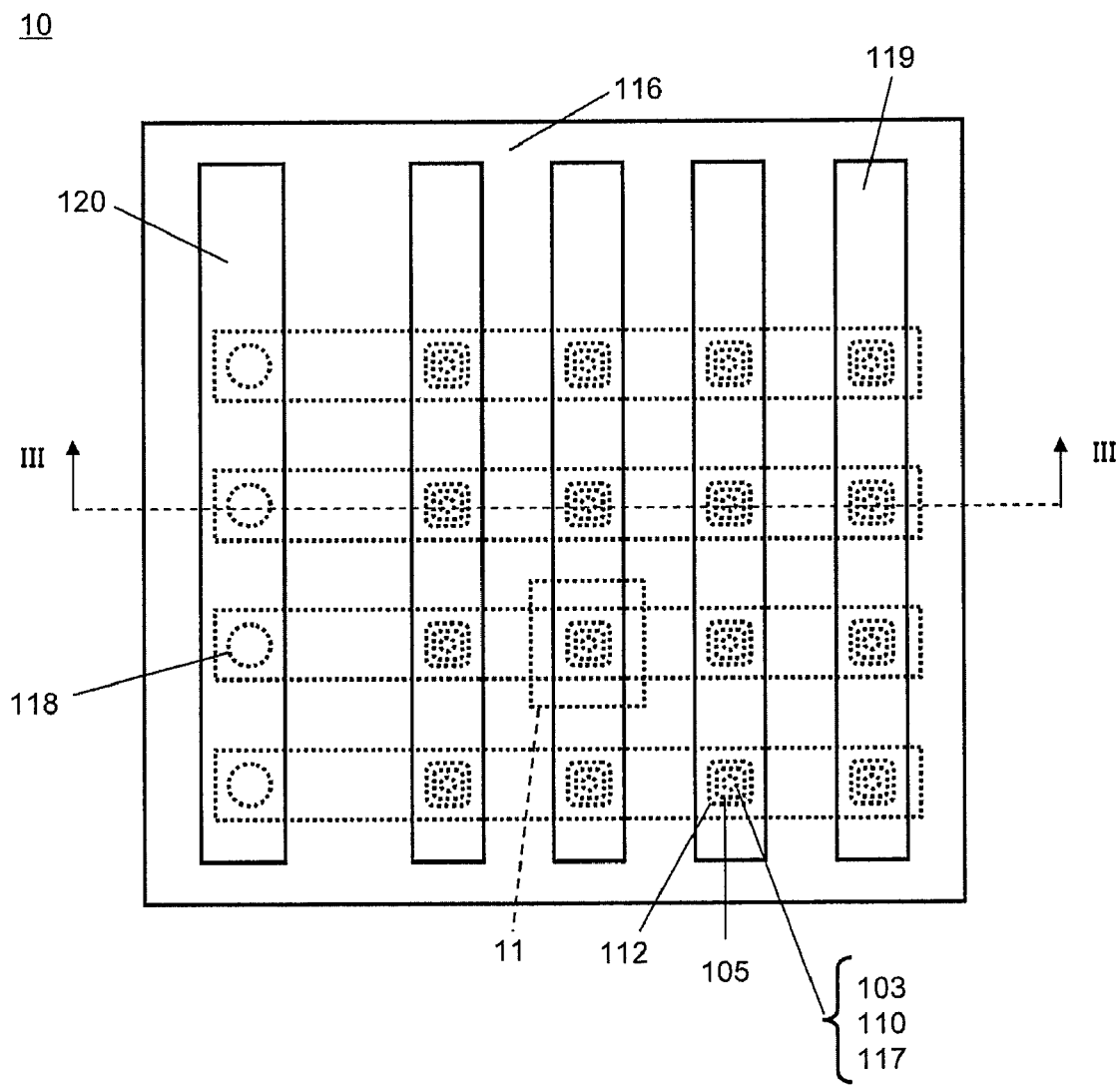
FIG. 2 is a schematic top plan view showing the semiconductor memory device of FIG. 1.
Figure 3:
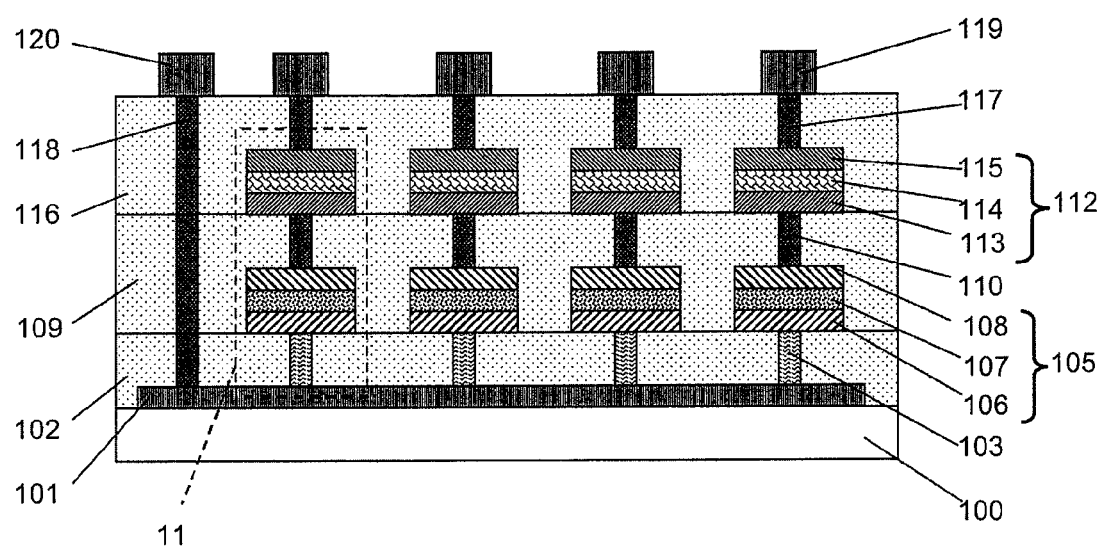
FIG. 3 is a schematic cross-sectional view showing the semiconductor memory device of FIG. 1.

FIG. 1 is a schematic circuit diagram showing a nonvolatile semiconductor memory device 10 according to Embodiment 1 of the present invention. FIG. 2 is a schematic top plan view showing the nonvolatile semiconductor memory device 10 of FIG. 1, as viewed from above. FIG. 3 is a schematic cross-sectional view showing the nonvolatile semiconductor memory device 10 of FIG. 1, which is taken along line of FIG. 2.

As shown in FIG. 1, the semiconductor memory device 10 of this embodiment includes a nonvolatile memory element (nonvolatile memory element) 11 including a current controlling element 112, a resistance variable element 105 and a fuse 103 which are connected in series to each other. More specifically, one end of the fuse 103 is connected to a first wire (word line) 101, while one end of the current controlling element 112 is connected to a second wire (bit line) 119. Although in this embodiment, the current controlling element 112, the resistance variable element 105 and the fuse 103 are connected in series to each other in this order, between the first wire 101 and the second wire 119, similar advantages are also achieved by changing the arrangement positions of the current controlling element 112, the resistance variable element 105 and the fuse 103.

As shown in FIGS. 2 and 3, the semiconductor memory device 10 of this embodiment includes a substrate 100, a plurality of first wires 101 arranged on a main surface of the substrate 100 to extend in parallel with each other in a first direction (rightward and leftward direction in FIGS. 2 and 3), a plurality of second wires (bit lines) 119 provided above the plurality of first wires 101 to extend in parallel with each other in a second direction (direction perpendicular to the drawing sheet in FIG. 3, in an upward and downward direction in FIG. 1) such that the second wires 119 three-dimensionally cross the plurality of first wires (word lines 101), within a plane parallel to the main surface of the substrate 100, and a nonvolatile memory element array including a plurality of nonvolatile memory elements 11 provided to respectively correspond to three-dimensional cross-points of the first wires 101 and the second wires 119 and to connect the first wires 101 to the second wires 119, respectively.

The nonvolatile memory element 11 includes the fuse 103, the resistance variable element 105, the current controlling element 112, and a second contact plug 110 connecting the resistance variable element 105 to the current controlling element 112.

The resistance variable element 105 includes a lower electrode (first electrode) 106, an upper electrode (second electrode) 108, and a resistance variable layer 107 interposed between the lower electrode 106 and the upper electrode 108. The lower electrode 106 is physically in contact with the resistance variable layer 107, while the upper electrode 108 is physically in contact with the resistance variable layer 107.

The current controlling element 112 includes a lower electrode (third electrode) 113, an upper electrode (fourth electrode) 115 and an insulator layer or semiconductor layer 114 interposed between the lower electrode 113 and the upper electrode 115. The lower electrode 113 is physically in contact with the insulator layer or semiconductor layer 114, while the upper electrode 115 is physically in contact with the insulator layer or semiconductor layer 114.

A first interlayer insulating layer 102 is formed over the substrate 100 to cover the first wires 101. A plurality of resistance variable elements 105 are formed on the first interlayer insulating layer 102 such that the resistance variable elements 105 are arranged at equal intervals on the first wire 101 when viewed from a main surface side of the substrate 100 (from above in FIG. 3). The first wire 101 is connected to the lower electrode 106 of the resistance variable element 105 located above the first wire 101 via the fuse 103 serving as the first contact plug penetrating the first interlayer insulating layer 102.

A second interlayer insulating layer 109 is formed over the first interlayer insulating layer 102 to cover the resistance variable elements 105. A plurality of current controlling elements 112 are formed on the second interlayer insulating layer 109 such that the current controlling elements 112 are positioned to overlap with the resistance variable elements 105, respectively, when viewed from the main surface side of the substrate 100. The upper electrode 108 of the resistance variable element 105 is connected to the lower electrode 113 of the current controlling element 112 via the second contact plug 110 without directly contacting the resistance variable layer 107 of the resistance variable element 105 and the semiconductor layer 114 of the current controlling element 112.

A third interlayer insulating layer 116 is formed over the second interlayer insulating layer 109 to cover the current controlling elements 112. A second wire 119 is formed on the third interlayer insulating layer 116 such that the second wire 119 crosses the first wire 101 perpendicularly to the first wire 101 and is positioned to overlap with the resistance variable element 105 and the current controlling element 112 when viewed from the main surface side of the substrate 100. The second wire 119 is connected to the upper electrode 115 of the current controlling element 112 located below the second wire 119 via a third contact plug 117 penetrating the third interlayer insulating layer 116.

As described above, the nonvolatile memory element 11 includes the fuse 103 which is provided between the first wire 101 and the lower electrode 106 of the resistance variable element 105 and serves as the first contact plug for electrically connecting them, the second contact plug 110 which is provided between the upper electrode 108 of the resistance variable element 105 and the lower electrode 113 of the current controlling element 112 and electrically connects them, and the third contact plug 117 which is provided between the upper electrode 115 of the current controlling element 112 and the second wire 119 and electrically connects them. Although in this embodiment, the fuse 103 is provided as the first contact plug, the fuse 103 may be configured as the second or third contact plug. In that case, similar advantages are achieved.

A lead-out wire 120 is formed on the third interlayer insulating layer 116 such that the lead-out wire 120 is located outside the section where the nonvolatile memory elements 11 are arranged when viewed in the thickness direction, and extends in parallel with the second wire 119 in the second direction. The first wire 101 is connected to the lead-out wire 120 via a fourth contact plug 118 penetrating the first interlayer insulating layer 102, the second interlayer insulating layer 109 and the third interlayer insulating layer 118.

The first wire 101, the second wire 119 and the lead-out wire 120 comprise, for example, an electrically conductive material such as aluminum. The first interlayer insulating layer 102, the second interlayer insulating layer 109 and the third interlayer insulating 116 comprise, for example, an insulating material such as silicon oxide. The second contact plug 110, the third contact plug 117 and the fourth contact plug 118 except for the first contact plug serving as the fuse 103, comprise, for example, an electrically conductive material such as tungsten.

The fuse 103 is configured to be blown when the current controlling element 112 becomes substantially short-circuited. To be more specific, the fuse 103 is designed not to be blown and fused by an operating current of the nonvolatile memory element 11 but to be blown and fused by a current with a predetermined current value or more.

In this configuration, the nonvolatile semiconductor memory device 10 is implemented to include the cross-point nonvolatile memory element array in which the nonvolatile memory elements 11 are respectively provided at three-dimensional cross-points of the first wires 101 and the second wires 119 which cross each other, when viewed from the main surface side of the substrate 100.

[Configuration of Resistance Variable Element]

In the resistance variable element 105 of this embodiment, the resistance variable layer 107 contains an oxygen-deficient transition metal oxide (transition metal oxide having less oxygen content [atom ratio: ratio of the number of oxygen atoms to total number of atoms] than a stoichiometric oxide). Preferably, the resistance variable layer 107 includes a transition metal oxide comprising oxygen-deficient oxide of tantalum ($TaO_x$: $0<x<2.5$) or oxygen-deficient oxide of hafnium ($HfO_x$: $0<x<2$). More preferably, the resistance variable layer 107 consists of oxygen-deficient oxide of tantalum or oxygen-deficient oxide of hafnium. These resistance variable layers exhibit reversible and stable resistance value changing characteristic.

The resistance variable element comprising the oxygen-deficient transition metal oxide changes its resistance values reversibly by applying voltage pulses with a short pulse width of 100 ns or less.

In the resistance variable element 105 of this embodiment, when a standard electrode potential of a material (first material) constituting the lower electrode 106 is V1, a standard electrode potential of a material (second material) constituting the upper electrode 108 is V2, and a standard electrode potential of a transition metal (in a case where the oxidation number of this transition metal is zero) in the oxygen-deficient transition metal oxide included in the resistance variable layer 107 is Vt, Vt<V2 and V1<V2 are satisfied.

Since Vt<V2 is satisfied, the material of the upper electrode 108 is oxidized less easily than the material of the resistance variable layer 107. As a result, the material of the upper electrode 108 is not oxidized and reduced but the material of the resistance variable layer 107 is oxidized and reduced when electrons migrate at an interface between the upper electrode 108 and the resistance variable layer 107. This causes a change in an oxidation state of a region of the resistance variable layer 107 which is in the vicinity of the interface between the resistance variable layer 107 and the upper electrode 108, and results in a resistance changing phenomenon.

Since V1<V2 is satisfied, redox reaction at the electrode interface occurs preferentially at the upper electrode 108 side. In other words, the resistance changing phenomenon is allowed to occur only near the interface of the upper electrode side.

In this embodiment, the resistance values of the resistance variable element 105 are changed using voltage pulses with different polarities. When the resistance variable element 105 changes to the high-resistance state (reset operation is performed), a positive voltage (positive electric signal) is applied to the upper electrode 108 side on the basis of the lower electrode 106, and a current flows from the upper electrode 108 to the lower electrode 106. Thereby, at the upper electrode side, electrons migrate from the resistance variable layer 107 to the electrode. As a result, the material of the resistance variable layer 107 is oxidized and the resistance value increases.

When the resistance variable element 105 changes to the low-resistance state (set operation is performed), a negative voltage (negative electric signal) is applied to the upper electrode 108 side on the basis of the lower electrode 106, and a current flows from the lower electrode 106 to the upper electrode 108. Thereby, at the upper electrode side, electrons migrate from the electrode to the resistance variable layer 107. As a result, the material of the resistance variable layer 107 is reduced and its resistance value decreases.

As the lower electrode 106, for example, tantalum nitride (TaN) may be used. As the upper electrode 108, for example, platinum (Pt) may be used. When the standard electrode potential of the lower electrode is V1, V1=0.48V (standard electrode potential of tantalum nitride). When the standard electrode potential of the upper electrode is V2, V2=1.18V (standard electrode potential of platinum).

When the resistance variable layer 107 is tantalum oxide, Vt=−0.6V (standard electrode potential of tantalum). Therefore, Vt<V2 and V1<V2 are satisfied.

When the resistance variable layer 107 is hafnium oxide, Vt=−1.55V (standard electrode potential of hafnium). In this case, also, Vt<V2 and V1<V2 are satisfied.

The thickness of the resistance variable layer 107 may be set to, for example, 50 nm.

[Configuration of Current Controlling Element]

In this embodiment, as described above, the resistance values of the resistance variable element 105 are changed using voltage pulses with different polarities. Therefore, it is necessary to flow a current through the nonvolatile memory element 11 in both directions, and the bidirectional current controlling element 112 is used. The current controlling element 112 is an element having a non-linear current-voltage characteristic, in which its resistance value is high (off-state) when the absolute value of the applied voltage is less than a threshold voltage, while its resistance value is extremely low (on-state) when the absolute value of the applied voltage is not less than the threshold voltage.

In this embodiment, the current controlling element 112 is configured as, for example, a MSM diode which includes, the lower electrode 113 comprising tungsten, the semiconductor layer 114 comprising a silicon nitride layer, and the upper electrode 115 comprising tantalum nitride. The thickness of the semiconductor layer 114 may be set to, for example, 3~20 nm. The silicon nitride layer can be easily formed to have a semiconductive property. Therefore, the current controlling element 112 configured as the MSM diode can be manufactured in a simple manufacturing process. For example, nitrogen-deficient silicon nitride layer ($SiN_x$: 0<x<1.33) can be deposited by, for example, reactive sputtering in nitrogen gas atmosphere using a Si target. In this case, the nitrogen-deficient silicon nitride layer may be deposited under the conditions in which the temperature is a room temperature, the pressure in the chamber is 0.1 Pa~1 Pa, and $Ar/N_2$ flow rate is 18 sccm/2 sccm. In a case where the $SiN_x$ layer is deposited in a thickness of, for example, 16 nm, a current density of $2.5 \times 10^3$ A/cm$^2$ is obtained by applying a voltage of 1.6V, and a current density of $5 \times 10$ A/cm$^2$ is obtained by applying a voltage of 0.4V. Therefore, in a case where these voltages are satisfactorily used as a basis, an ON/OFF ratio is 50, and the $SiN_x$ layer can be used as the current controlling element 112 having a non-ohmic characteristic. The current controlling element 112 may be a MIM diode including an insulator layer 114 between the lower electrode 113 and the upper electrode 115. In that case, as the material of the insulator layer 114, $SiO_2$, $Si_3O_4$, $Ta_2O_5$, etc may be used. The MSM diode is more advantageous when a higher current is desired to flow in ON-state.

[Operation of Nonvolatile Memory Element in Normal State]

Figure 4:
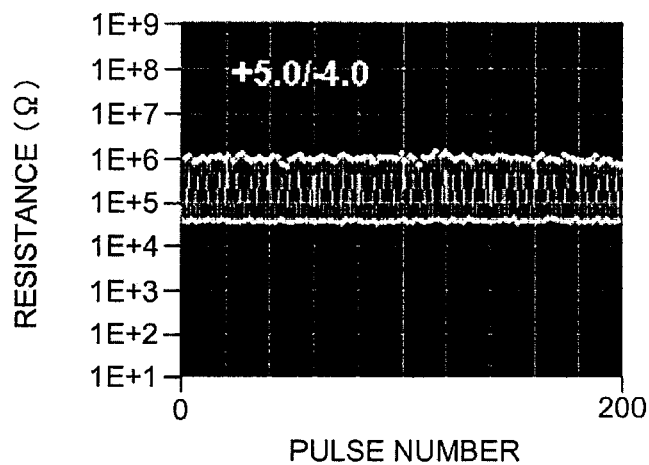
FIG. 4 is a view showing a characteristic of the current controlling element which is associated with resistance change, according to this embodiment.
Figure 4:
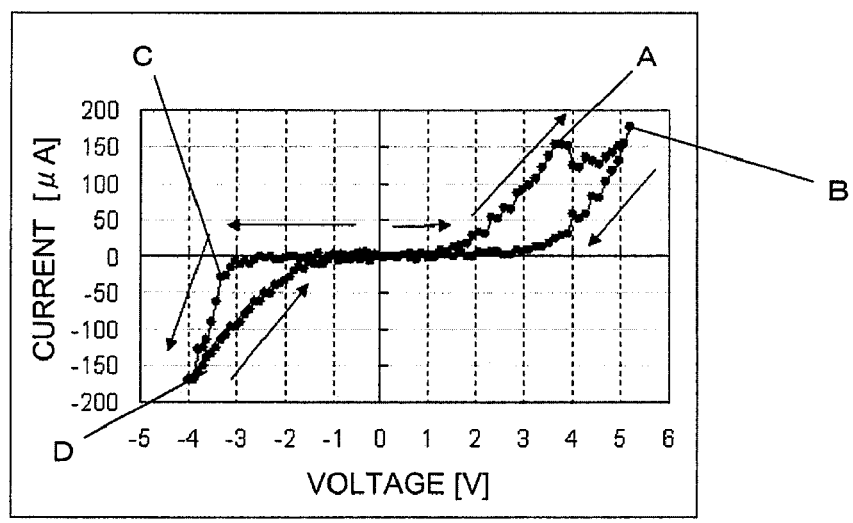

Hereinafter, a characteristic in a case where the resistance variable element 105 including a tantalum oxygen-deficient oxide (layer thickness: about 30 nm) as the resistance variable layer 107 is connected in series with the current controlling element 112 including nitrogen-deficient silicon nitride as the semiconductor layer 114 will be described. FIG. 4 is a view showing a characteristic of the current controlling element of this embodiment, which is associated with resistance change. FIG. 4(a) is a graph showing a change in the resistance values occurring when voltage pulses are applied and FIG. 4(b) is a graph showing an example of a current-voltage characteristic of resistance change.

In the example of FIG. 4(a), a voltage pulse with a voltage value of +5.0V and a pulse width 100 ns and a voltage pulse with a voltage value of −4.0V and a pulse width 100 ns are applied alternately to the upper electrode 115 on the basis of the lower electrode 106, between the lower electrode 106 and the upper electrode 115. In this case, as shown in FIG. 4(a), the resistance value of the nonvolatile memory element 11 including the resistance variable element 105 becomes about 1E6 (1M)Ω (high-resistance state) by applying the voltage pulse with a voltage value of +0.5V. On the other hand, the resistance value becomes about 80 kΩ (low-resistance state) by applying the voltage pulse with a voltage value of −4.0V. In this case, an operating current is about ±200 μA. These resistance values are read using a voltage of 2V. As should be appreciated from this, there is one-digit or larger difference in the resistance value of the nonvolatile memory element 11 between the high-resistance state and the low-resistance state of the resistance variable element 105.

To be more specific, as shown in FIG. 4(b), when a positive voltage is applied to the upper electrode 115 on the basis of the lower electrode 106 such that an absolute value of the voltage gradually increases, the resistance variable element 105 starts changing from the low-resistance state toward the high-resistance state (changing to the high-resistance state) at point A and finally reaches the high-resistance state at point B. At point A, the voltage is about +3.6V, and the current is about +150 µA, while at point B, the voltage is about +5.2V, and the current is +180 µA. Next, when a negative voltage is applied to the upper electrode 115 on the basis of the lower electrode 106 with respect to the resistance variable element 105 in the high-resistance state such that an absolute value of the voltage gradually increases, the resistance variable element 105 starts changing from the high-resistance state toward the low-resistance state (changing to the low-resistance state) at point C and finally reaches the low-resistance state at point D.

At point C, the voltage is about −3.3V, and the current is about −25 µA, while at point D, the voltage is about −4.0V, and the current is about −170 µA.

[Operation Performed when Failure has Occurred in Nonvolatile Memory Element]

Figure 5:
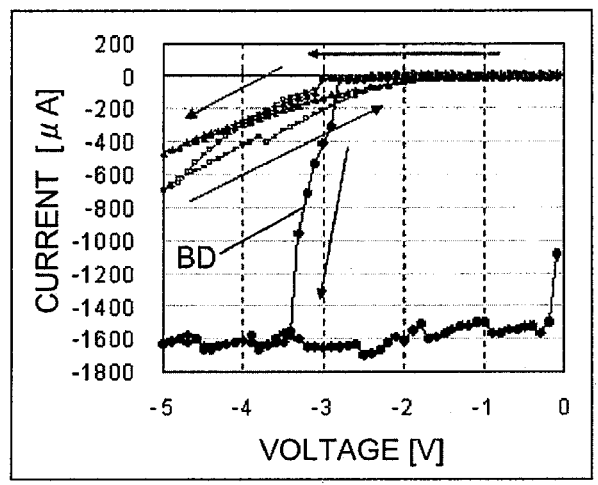
FIG. 5 is a view showing a current-voltage characteristic of a nonvolatile memory element and a load characteristic of a fuse when a failure has occurred in the nonvolatile memory element, according to this embodiment.
Figure 5:
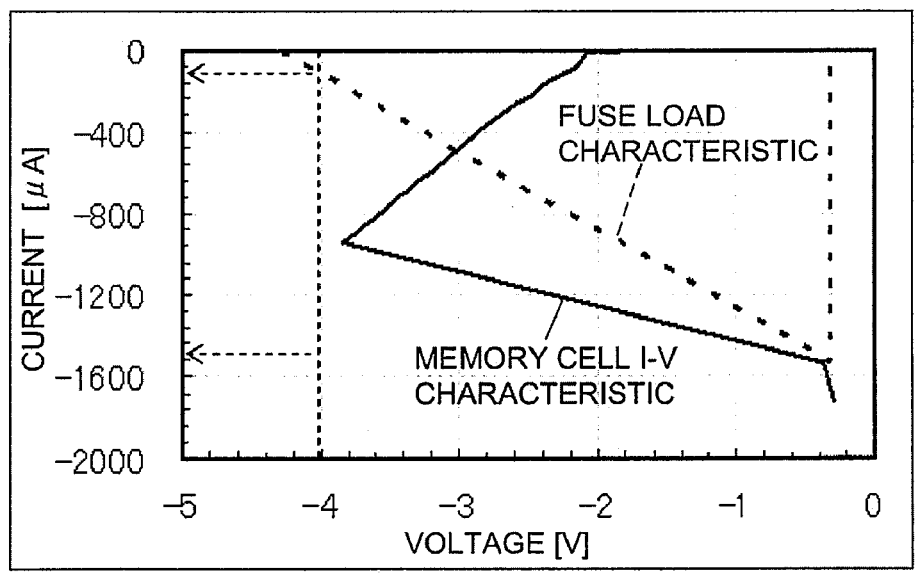
Figure 6:
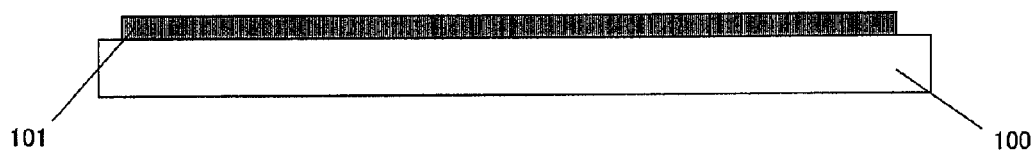
FIG. 6 is a schematic view showing the steps of a manufacturing method of the semiconductor memory device of FIG. 1.
Figure 6:
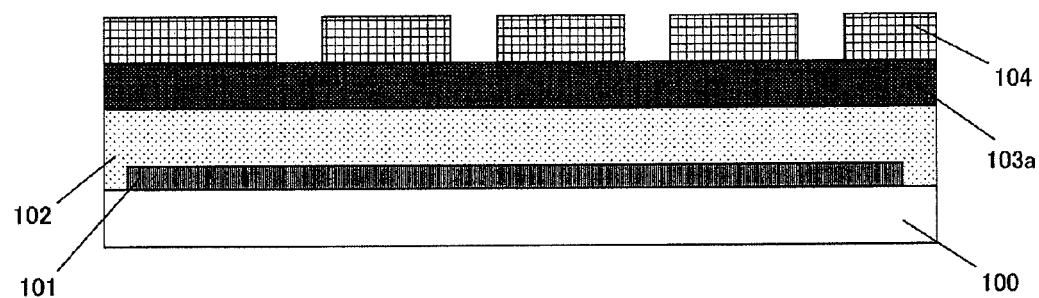
Figure 6:
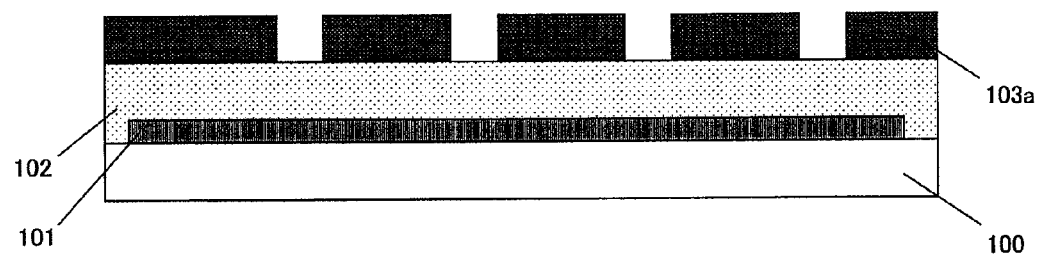
Figure 7:
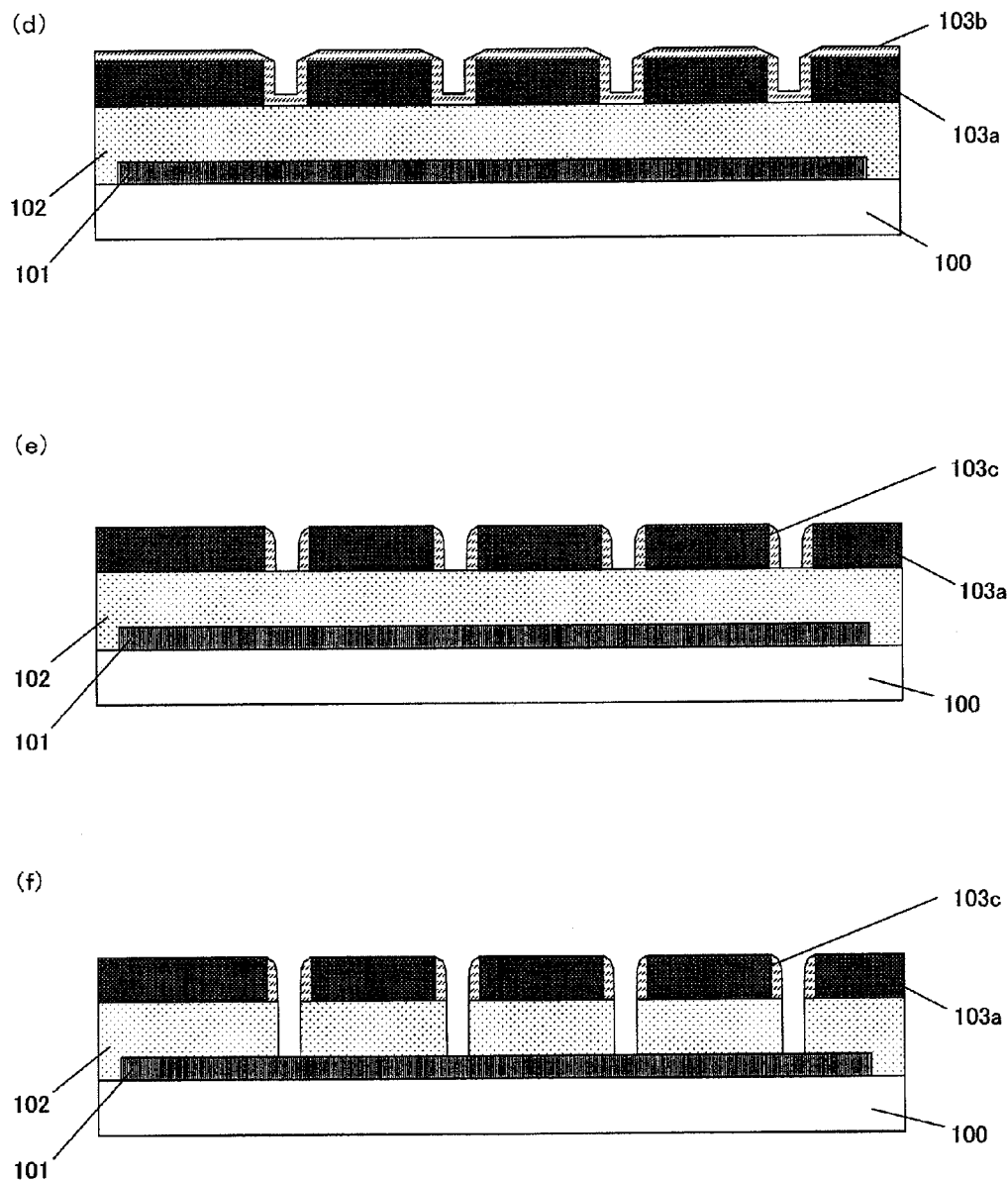
FIG. 7 is a schematic view showing the steps of a manufacturing method of the semiconductor memory device of FIG. 1.
Figure 8:
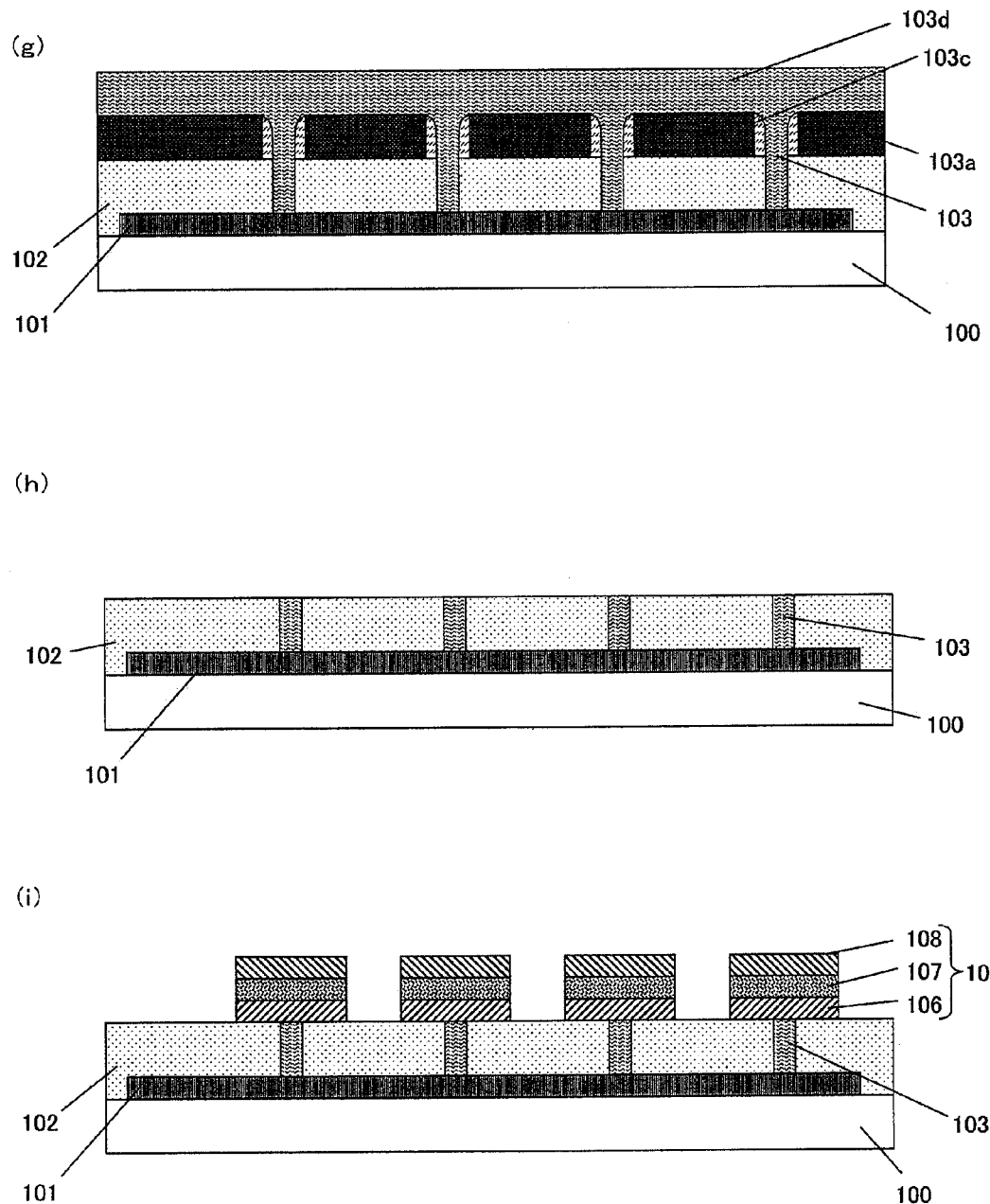
FIG. 8 is a schematic view showing the steps of the manufacturing method of the semiconductor memory device of FIG. 1.
Figure 9:
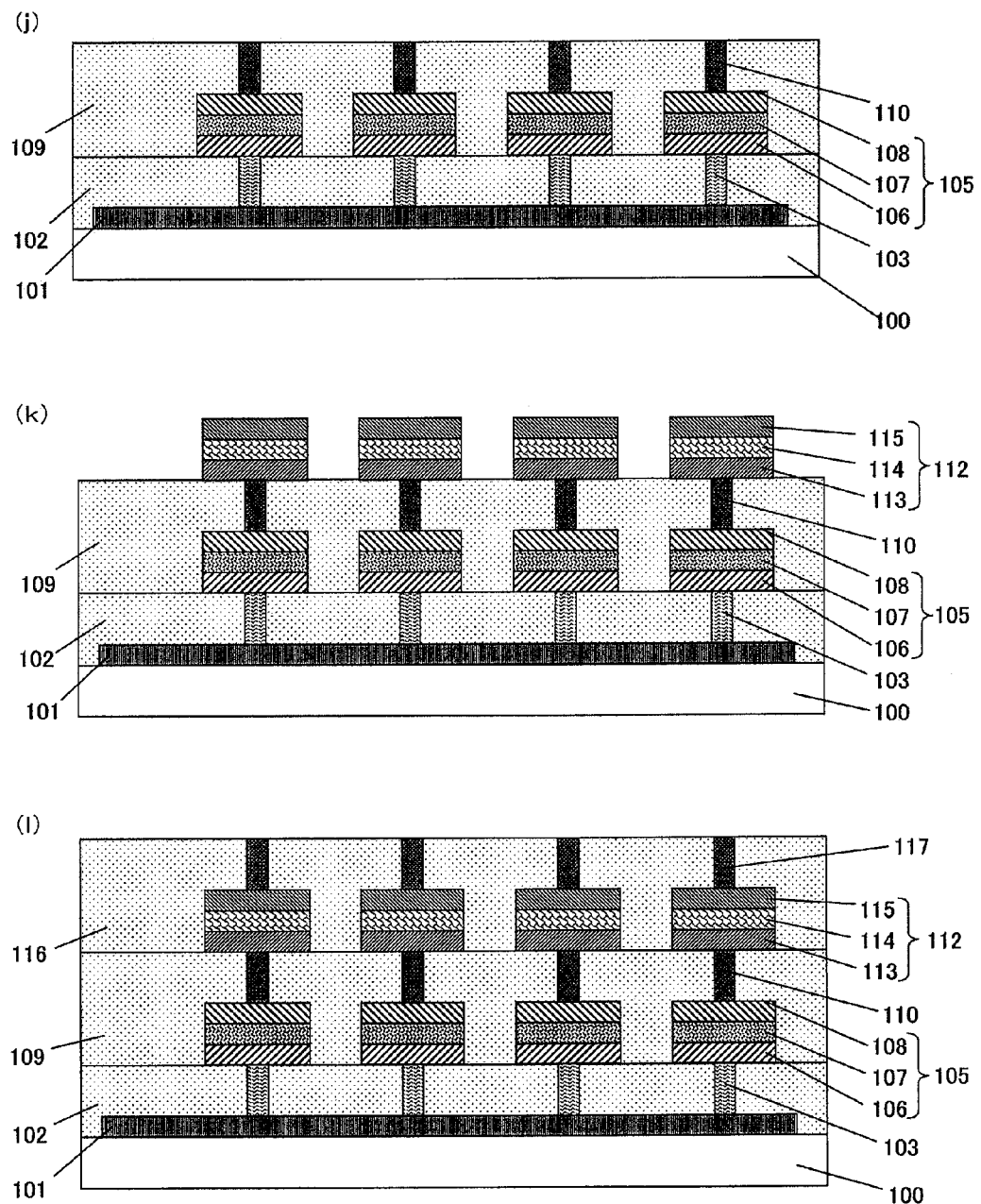
FIG. 9 is a schematic view showing the steps of the manufacturing method of the semiconductor memory device of FIG. 1.
Figure 10:
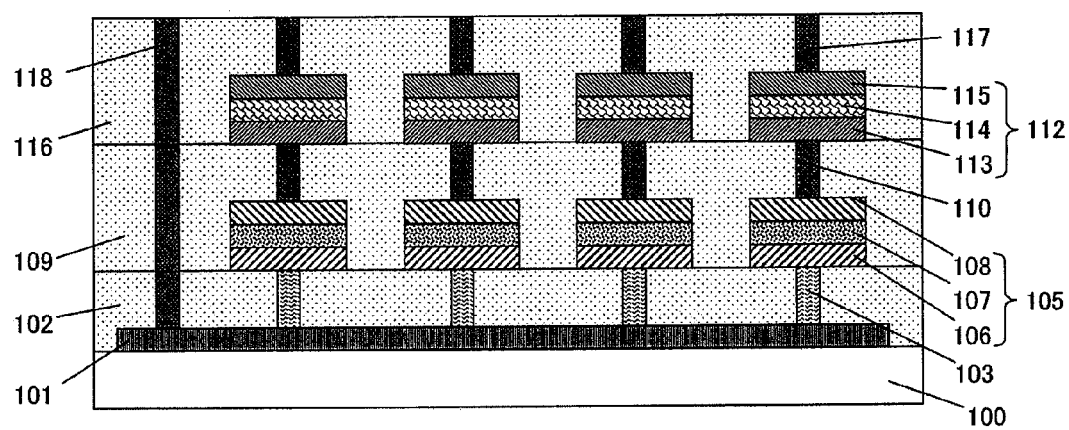
FIG. 10 is a schematic view showing the steps of the manufacturing method of the semiconductor memory device of FIG. 1.
Figure 10:
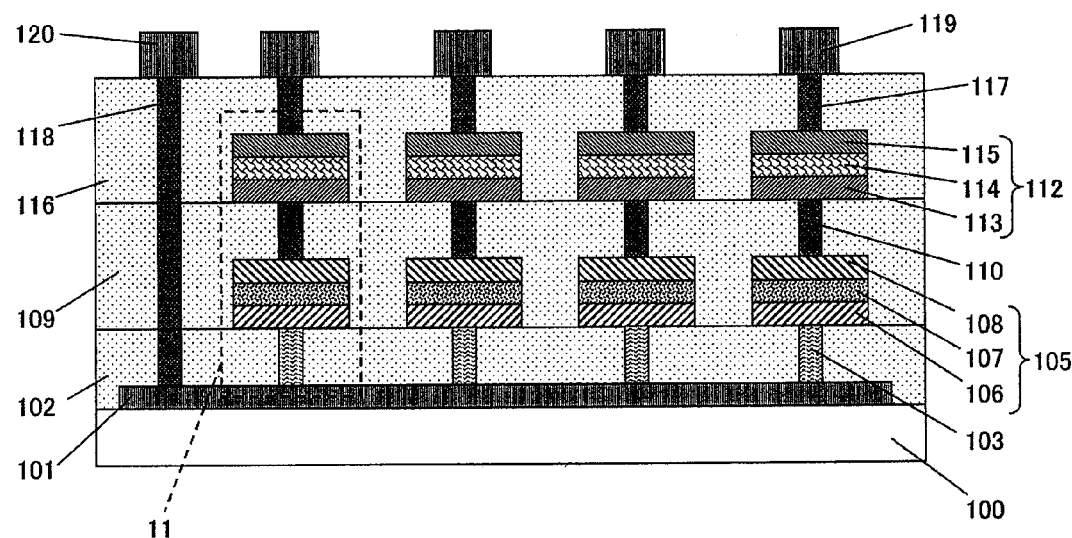

FIG. 5 is a current-voltage characteristic of a nonvolatile memory element and a load characteristic of a fuse when a failure has occurred in the nonvolatile memory element, according to this embodiment. FIG. 5(*a*) is an enlarged partial view of the graph showing the current-voltage characteristic of the nonvolatile memory element in the failed state. FIG. 5(*b*) is a graph showing the load characteristic of the fuse.

If a failure occurs in a certain nonvolatile memory element 11 during manufacturing process steps or operation, the current controlling element 112 is substantially short-circuited. In this case, as shown in FIG. 5(*a*), a voltage of about 4.0V is applied to the nonvolatile memory element 11 having the current-voltage characteristic of FIG. 4, and a breakdown current BD of about 1500 µA flows through the nonvolatile memory element 11. This causes the resistance variable element 105 in the nonvolatile memory element 11 in the failed state to have a resistance value (e.g., about 100Ω) lower than the resistance value of the resistance variable element 11 in the low-resistance state. Therefore, most part of the voltage applied to the nonvolatile memory element 11 in the failed state is applied onto the fuse 103.

In contrast, as shown in FIG. 5(*b*), the fuse 103 has a load characteristic in which an allowable current (its absolute value) is higher as a voltage (its absolute value) applied in a predetermined voltage range is lower and is lower as the applied voltage (its absolute value) is higher. In other words, the fuse 103 is more easily blown and fused as the allowable current (its absolute value) is lower.

As described above, in the nonvolatile memory element 11 in the failed state, the voltage of about +4.0V is applied to the fuse 103. As shown in FIG. 5(*b*), when the voltage of about +4.0V is applied to the fuse 103, the allowable current in the fuse 103 is about 100 µA. On the other hand, the breakdown current BD flowing through the fuse 103 when the nonvolatile memory element 11 is in the failed state, is about 1500 µA as described above. As a result, the breakdown current BD flowing through the nonvolatile memory element 11 causes Joule heat beyond an allowable amount to be generated in the fuse 103, which is thereby blown and fused. It is presumed that in this case, the fuse 103 which has been blown and fused migrates to a region of the interlayer insulating layer 102 in the vicinity of the fuse 103, and thus an insulating state is maintained. After the fuse 103 has been blown and fused, the nonvolatile memory element 11 in the failed state maintains a resistance value (e.g., 1E7 (10M)Ω or more) which is not lower than the resistance value of the resistance variable element 105 in the high-resistance state.

After that, when a current is flowed through the same row or column as that to which the nonvolatile memory element 11 in the failed state flows, the current is prevented from flowing through the nonvolatile memory element 11 in the failed state, while the current flows, via its adjacent row or column, to another nonvolatile memory element 11 belonging to the same row or column as that to which the nonvolatile memory element 11 in the failed state belongs. Therefore, another nonvolatile memory element 11 is accessible and can perform a normal operation. Thus, even when a failure occurs in a certain nonvolatile memory element 11, it is possible to effectively avoid an event that data cannot be written to and read from another nonvolatile memory element 11 belonging to the same row or column as that to which the nonvolatile memory element 11 in the failed state belongs.

Especially, the oxygen-deficient transition metal oxide used as the resistance variable layer 107 of the resistance variable element 105 of this embodiment changes its resistance values reversibly by application of voltage pulses with a short pulse which is not more than 100 nsec, as described above. In other words, by merely applying a voltage pulse with a very short pulse width, a current sufficient to enable the nonvolatile memory element 11 to operate normally can be flowed through the nonvolatile memory element 11. This implies that an amount of a current flowing through the fuse 103 per unit area is made larger by the current controlling element 112. Therefore, in the configuration in which the current controlling element 112, the resistance variable element 105 and the fuse 103 are connected in series, the current flowing through the nonvolatile memory element 11 in the failed state causes Joule heat for easily blowing and fusing the fuse 103 to be generated quickly in the fuse 103, even though the voltage pulse with a very short pulse is applied.

In accordance with the above configuration, the nonvolatile element 11 in the failed state is automatically rendered inoperative as a result of blowing and fusing of the fuse 103. Therefore, during manufacture and during use of the semiconductor memory device, even when a failure occurs in a certain nonvolatile memory element 11, it is possible to ensure the operation of another nonvolatile memory element 11 belonging to the same row or column as that to which the nonvolatile memory element 11 in the failed state belongs

[Configuration of Fuse]

As described above, the fuse 103 is designed not to be blown and fused by the operating current of the nonvolatile memory element 11 but to be blown and fused by a current with a predetermined current value or more. The degree to which the fuse 103 is easily blown and fused can be predicted according to a mean time between failure MTBF (Mean-Time-Between-Failure) expressed as the following formula.

$$MTBF = KJ^{-n} \exp(qE_a/kT)$$

where K is a constant, J is a current density, n is generally a value in a range of 1.0~5.0, $E_a$ is an activation energy, k is a Boltzman constant, and T is an absolute temperature. As can be seen from this formula, the fact that the current density J is higher means that MTBF is shorter. From this, as the current density J is higher, the fuse 103 is blown and fused more easily.

Based on exponential dependency of $qE_a/kT$, as the temperature is higher, MTBF is shorter. Therefore, the fuse 103 is blown and fused more easily as its temperature is higher. The temperature of the fuse 103 is primarily determined by a heat energy transferred by Joule heat generated by the current. The amount of heat is a product of a square of a current value and the resistance value of the fuse 103. In some cases, the rate of heating of the fuse 103 is decreased by heat generation and thereby resistance change of the fuse 103 is impeded. Accordingly, it is necessary to supply the current for generating heat to the fuse 103 quickly and to retain the heat in the fuse for a short time required for the fuse 103 to complete changing its resistance. For example, a heat conductive material such as metal deprives heat, whereas an insulating material such as an insulator can release heat energy from the fuse relatively gently. In view of this, in preferable design, the fuse is covered with an insulator layer and is apart from a metal wire.

In view of the above, the fuse 103 is stably operative by configuring the fuse 103 as the first contact plug covered with the interlayer insulating layer 102. The fuse 103 is covered with the interlayer insulating layer 102 provided around the fuse 103 and is connected to the upper and lower wires 101 and 106. Therefore, the length of the fuse 103 is preferably 500 nm or more.

A specific characteristic of the fuse 103 varies depending on the structure of its surrounding constituents. A specific structure of the fuse 103 may be suitably selected so as to obtain a desired characteristic according to a relationship with the resistance variable element and other constituents based on the above. For example, the contact plug (first contact plug) operative as the fuse 103 may have a smaller cross-sectional area than another contact plug (second and third contact plugs 110, 117). To be more specific, for example, the second and third contact plugs 110 and 117 have a circular cross-section of a diameter of 240 nm, while the fuse 103 which is the first contact plug is suitably configured to have a square cross-section of 70 nm×70 nm.

Furthermore, as described previously, it is sufficient that the fuse 103 has a resistance value which does not allow the fuse 103 to be blown and fused when the resistance variable element 105 changes reversibly between the high-resistance state and the low-resistance state, but allows Joule heat for blowing and fusing the fuse 103 to be generated in the fuse 103, when the nonvolatile memory element 11 changes to have the above mentioned resistance value which is higher than the resistance value of the resistance variable element in the high-resistance state.

For example, the fuse 103 preferably has a resistance value R(F) which is lower than a resistance value R (LR) of the resistance variable element 105 in the low-resistance state.

In the configuration in which the resistor having the above resistance value is connected in series with the resistance variable element 105 and the current controlling element 112, a current flowing through the resistance variable element 105 when the resistance variable element 105 changes to the low-resistance state is restricted, which makes it possible to effectively prevent insulation breakdown of the resistance variable element 105.

When the above mentioned voltage pulse with a short pulse width which is not more than 100 ns is applied when the resistance variable element 105 changes from the high-resistance state to the low-resistance state, there will be a chance that the current controlling element 112 connected in series with the resistance variable element 105 and having a non-linear current-voltage characteristic increases a current instantaneously, and a current whose value is higher than a desired current value flows through the resistance variable element 105. If the current whose value is higher than the desired current value flows through the resistance variable element 105, a resistance value lower than a resistance value corresponding to a desired low-resistance state sometimes results, and the current will not stop flowing through the resistance variable element 105 after application of the voltage pulse, which is undesirable. Therefore, there is a need to fall the voltage applied to the resistance variable element 105 instantaneously. If a resistor having a fixed resistance value is connected in series with the above resistance variable element 105, the voltage applied to the resistance variable element 105 decreases due to an increase in the current flowing through the resistor, and as a result, the current flowing through the resistance variable element 105 is restricted when the resistance variable element 105 changes to the low-resistance state.

In accordance with the above configuration, since the fuse 103 is operative as the series resistor for controlling the current when the resistance variable element 105 changes to the low-resistance state, it is not necessary to provide a series resistor separately and a normal operation of the nonvolatile memory element 11 can be performed stably without increasing a manufacturing cost.

To be specific, preferably, a sum of the resistance value R(F) of the fuse 103 and a resistance value R(D) of the current controlling element 112, in a case where a certain voltage is applied to the whole cell (fuse 103, current controlling element 112, resistance variable element 105) satisfies R (LR) ≦R(F)+R(D)<R (HR). More preferably, the fuse 103 has a resistance value of 5 kΩ or less.

The fuse 103 in this embodiment has, for example, a square cross-section of 70 nm×70 nm and a length of 500 nm, as described above, and comprises polysilicon with a resistivity of 0.03 Ω·cm. The fuse 103 has a resistance value which does not allow the fuse 103 to be blown and fused by the currents and the voltages by which the resistance variable element 105 changes reversibly between the high-resistance state and the low-resistance state but allows the fuse 103 to be blown and fused by a voltage of about 5V and a current of about 1500 µA when the nonvolatile memory element 11 is in a failed state.

In this embodiment, the fuse 103 comprises polysilicon. This makes it possible to manufacture the fuse 103 inexpensively and easily. Since the resistance value of the fuse 103 can be varied easily by varying an amount of impurities with which polysilicon is doped, it is possible to manufacture the fuse 103 having an optimal resistance value according to specification and the like. Alternatively, polysilicon may be chemically combined with metal to produce a silicide. In other words, as a material of the fuse 103, for example, SiNi, SiCo, SiCu, etc, may be used.

[Manufacturing Method]

FIGS. 6 to 10 are views showing the steps of the manufacturing method of the semiconductor memory device according to this embodiment. FIG. 6(a) is a view showing the step of forming the first wire on the substrate. FIG. 6(b) to FIG. 8(h) are views showing the steps of forming the first interlayer insulating layer and the fuse which is the first contact plug. FIG. 8(i) is a view showing the step of forming the resistance variable element. FIG. 9(j) is a view showing the step of forming the second interlayer insulating layer and the second contact plug. FIG. 9(k) is a view showing the step of forming the current controlling element. FIG. 9(l) is a view showing the step of forming the third interlayer insulating layer, and the third contact plug. FIG. 10(m) is a view showing the step of forming the fourth contact plug. FIG. 10(n) is a view showing the step of forming the second wire and the lead-out wire.

In the step shown in FIG. 6(a), the first wire 101 is formed on the substrate 100 provided with the transistor, the lower wire, and others using a desired mask.

As shown in FIG. 6(b)~FIG. 8(h), next, in the steps of forming the first interlayer insulating layer 102 and the fuse 103 which is the first contact plug, the first interlayer insulating layer 102 is formed over the entire surface of the substrate 100 to cover the first wire 101, and then, a contact hole (opening portion) is formed to penetrate the first interlayer insulating layer 102 and reach the first wire 101. A filling material containing polysilicon as a major component is filled into the contact hole, to form the fuse 103 which is the first contact plug.

To be specific, when forming the fuse 103 comprising polysilicon, initially, in the step shown in FIG. 6(b), a first polysilicon layer 103a is formed over the first interlayer insulating layer 102. Then, a photoresist layer is formed on the first polysilicon layer 103a, and an etching mask 104 is formed by patterning. Then, in the step shown in FIG. 6(c), the first polysilicon layer 103a is etched using the etching mask 104 to open the contact hole in the first polysilicon layer 103a, thereby exposing a portion of the first interlayer insulating layer 102. Further, in the step shown in FIG. 7(d), a second polysilicon layer 103b is formed over the entire surface which is on the main surface side of the substrate 100, including the upper side of the first polysilicon layer 103a and the inside of the contact hole. After that, in the step shown in FIG. 7(e), the second polysilicon layer 103b is etched to form side walls 103c comprising polysilicon on side walls of the contact hole. Thereafter, in the step shown in FIG. 7(f), a contact hole is opened to penetrate the first interlayer insulating layer 102 using the side walls 103c and the first polysilicon layer 103a as a mask, thereby exposing a portion of the first wire 101. After that, in the step shown in FIG. 8(g), a third polysilicon layer 103d is formed over the entire surface which is on the main surface side of the substrate 100 including the upper side of the side walls 103c and the upper side of the first polysilicon layer 103a while filling polysilicon into the contact hole. Then, in the step shown in FIG. 8(h), the third polysilicon layer 103d, the side walls 103c and the first polysilicon layer 103a are etched back using $Cl_2$ gas, thereby forming the fuse 103 comprising polysilicon inside the contact hole such that the fuse 103 penetrates the first interlayer insulating layer 102 and is connected to the first wire 101.

Then, in the step shown in FIG. 8(i), an electrically conductive layer comprising tantalum nitride, a resistance variable layer comprising oxygen-deficient tantalum oxide, and an electrically conductive layer comprising precious metal such as platinum are formed sequentially over the first interlayer insulating layer 102. Thereafter, these three layers are patterned using a specified mask produced by photolithography, thereby forming the lower electrode 106, the resistance variable layer 107 and the upper electrode 108 of the resistance variable element 105 such that these are positioned on and above the upper end surface of the fuse 103. The oxygen-deficient tantalum oxide can be deposited by, for example, so-called reactive sputtering in which sputtering is performed using a target comprising tantalum in argon and oxygen gas atmosphere.

Then, in the step shown in FIG. 9(j), the second interlayer insulating layer 109 is formed over the entire surface of the first interlayer insulating layer 102 to cover the resistance variable element 105. Then, a contact hole is formed to penetrate the second interlayer insulating layer 109 and reach the upper electrode 108 of the resistance variable element 105. Then, a filling material containing tungsten as a major component is filled into the contact hole to form the second contact plug 110.

Following that, in the step of forming the current controlling element 112 as shown in FIG. 9(k), an electrically conductive layer comprising tungsten, a semiconductor layer comprising silicon nitride, and an electrically conductive layer comprising tantalum nitride are formed sequentially over the second interlayer insulating layer 109. Thereafter, these three layers are patterned using a specified mask produced by photolithography, thereby forming the lower electrode 113, the semiconductor layer 114 and the upper electrode 115 of the current controlling element 112 such that they are located on and above the upper end surface of the third contact plug 110.

Then, in the step shown in FIG. 9(l), the third interlayer insulating layer 116 is formed over the entire surface of the second interlayer insulating layer 109 to cover the current controlling element 112. Then, a contact hole (opening portion) is formed to penetrate the third interlayer insulating layer 116 and reach the upper electrode 115 of the current controlling element 112. Then, a filling material comprising tungsten as a major component is filled into the contact hole to form the third contact plug 117.

Furthermore, in the step shown in FIG. 10(m), a contact hole (opening portion) is formed to penetrate the third interlayer insulating layer 116, the second interlayer insulating layer 109 and the first interlayer insulating layer 102 and reach the first wire 101. A filling material comprising tungsten as a major component is filled into the contact hole to form the fourth contact plug 118.

Finally, in the step shown in FIG. 10(n), the second wire 119 is formed on the third interlayer insulating layer 116 to cover the upper end surface of the third contact plug 117, and the lead-out wire 120 is formed on the third interlayer insulating layer 116 to cover the upper end surface of the fourth contact plug 118, using photolithography and by patterning.

By the manufacturing method as described above, it is possible to easily implement the resistance variable semiconductor memory device 10 which performs a resistance changing operation stably.

Embodiment 2

Figure 11:
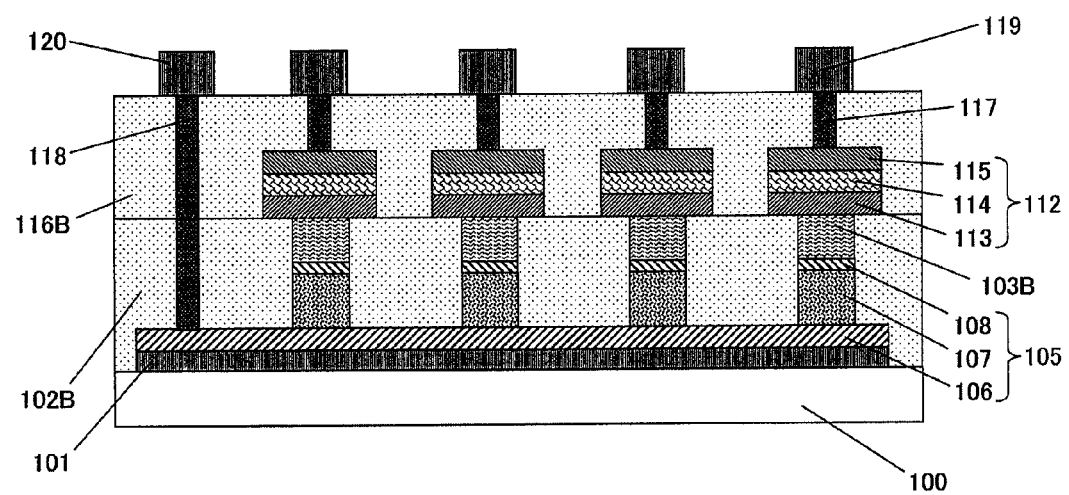
FIG. 11 is a schematic cross-sectional view showing a semiconductor memory device according to Embodiment 2 of the present invention.

FIG. 11 is a schematic cross-sectional view showing a semiconductor memory device 20 according to Embodiment 2 of the present invention. The semiconductor memory device 20 in this embodiment is different from the semiconductor memory device 10 of Embodiment 1 in that a fuse 103B is positioned between the resistance variable element 105 and the current controlling element 112. To be specific, in this embodiment, the fuse 103B serves as the second contact plug in Embodiment 1. Furthermore, the semiconductor memory device 20 of this embodiment is configured in such a manner that the first contact plug in Embodiment 1 is not present but the lower electrode 106 of the resistance variable element 105 is directly connected to the first wire 101.

To be more specific, the lower electrode 106 of the resistance variable element 105 is formed on the first wire 101. The resistance variable layer 107 and the upper electrode 108 of the resistance variable element 105 and the fuse 103B are formed inside the opening portion (memory cell hole) formed in an interlayer insulating layer 102B. Thus, in manufacturing process steps, masks and manufacturing process steps can be reduced in number. The other constituents in this embodiment are identical to those of Embodiment 1, and therefore, in Embodiment 2, the same constituents as those in Embodiment 1 are designated by the same reference characters and names and will not be described repetitively.

Figure 12:
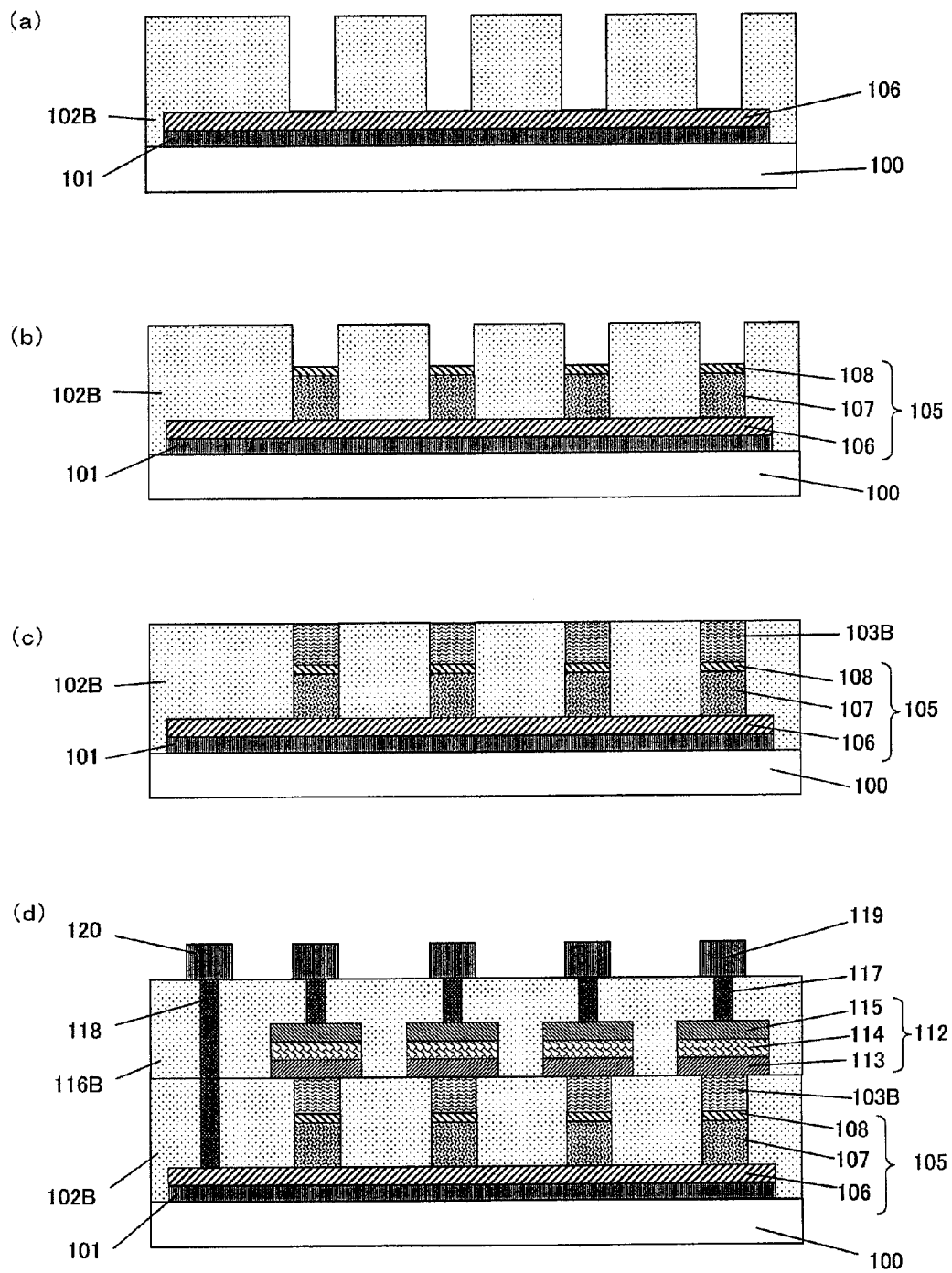
FIG. 12 is a schematic view showing the steps of a manufacturing method of the semiconductor memory device of FIG. 11.
Figure 13:
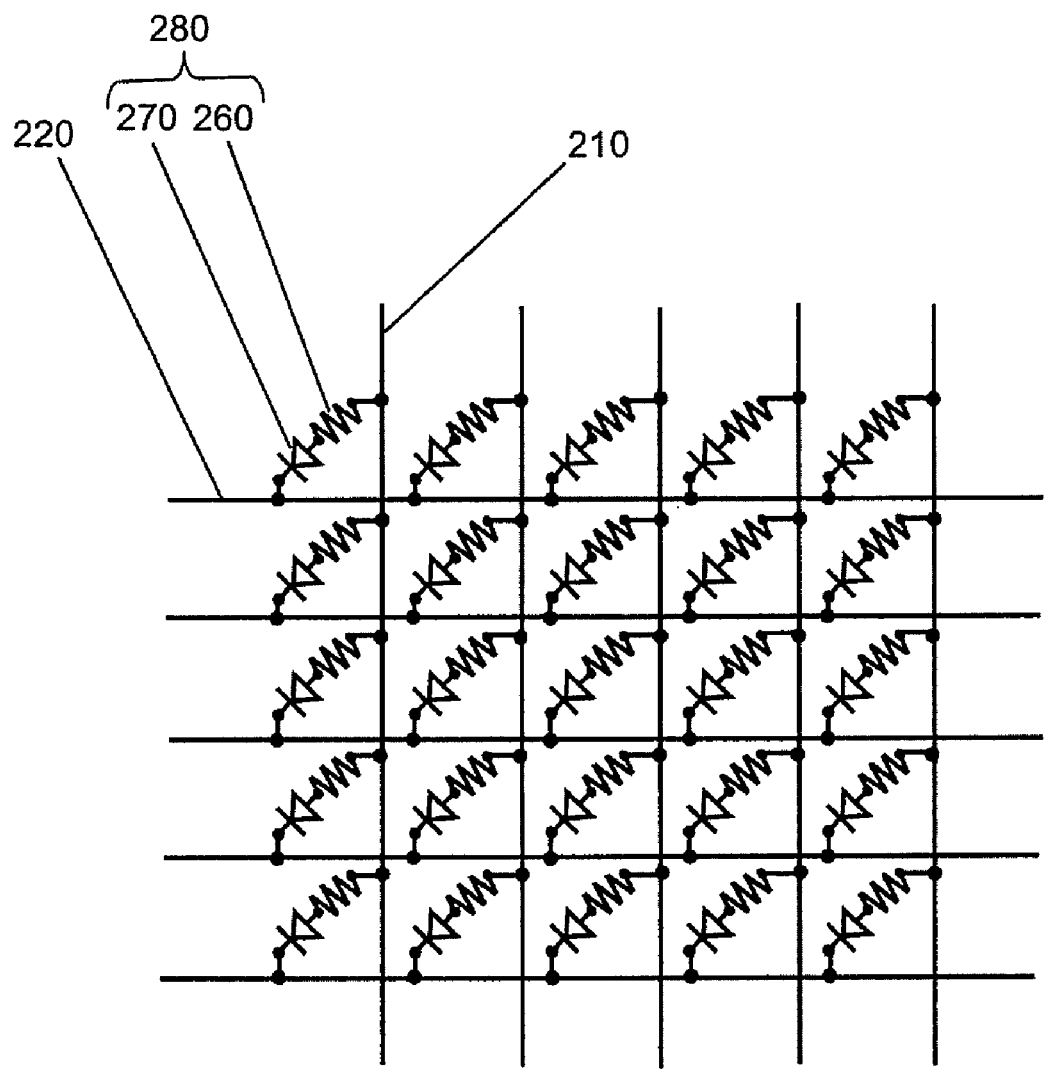
FIG. 13 is a schematic circuit diagram showing a conventional semiconductor memory device.

A manufacturing method of the semiconductor memory device 20 in Embodiment 2 configured as described above will be described. FIG. 12 is a schematic view showing the steps of a manufacturing method of the semiconductor memory device of FIG. 11.

Initially, in the step shown in FIG. 12(a), the first wire 101 and the lower electrode 106 of the resistance variable element 105 are formed on the substrate 100 provided with the transistor, the lower wire and others using a specified mask, and a lower interlayer insulating layer 102B comprising a silicon oxide layer is formed over the entire surface to cover the lower electrode 106. Thereafter, an opening portion (memory cell hole) is formed to penetrate the lower interlayer insulating layer 102B and to be connected to the lower electrode 106.

Then, in the step shown in FIG. 12(*b*), tantalum oxide of the resistance variable layer 107 is deposited inside the memory cell hole. The tantalum oxide is deposited by, for example, so-called reactive sputtering in which sputtering is performed using a target comprising tantalum in argon and oxygen gas atmosphere. The tantalum oxide is deposited by sputtering until the tantalum oxide has been fully filled into the memory cell hole. Then, an unnecessary portion of the tantalum oxide which is located on the lower interlayer insulating layer 102B is removed by CMP, thereby forming the resistance variable layer 107 only inside the memory cell hole. In a case where hafnium oxide is used as the resistance variable layer 107, the hafnium oxide is deposited by, for example, reactive sputtering in which sputtering is performed using target comprising hafnium in argon and oxygen gas atmosphere in the same manner. Further, etching back is performed in such a manner that the resistance variable layer 107 formed inside the memory cell hole is selectively etched with respect to the lower interlayer insulating layer 102B. As a result, the resistance variable layer 107 comprising tantalum oxide with about 50 nm thickness is formed inside the memory cell hole and a recess is formed in the memory cell hole. The depth of the recess is about 600 nm.

Then, tantalum nitride is formed over the entire surface to cover the recess in the memory cell hole. Etching back is performed under the condition in which the tantalum nitride formed inside the memory cell hole is selectively etched with respect to the lower interlayer insulating layer 102B. As a result, the upper electrode 108 comprising tantalum nitride with about 50 nm thickness is formed inside the memory cell hole, and a recess is formed in the memory cell hole again. The depth of the recess in this case is about 500 nm.

Then, in the step shown in FIG. 12(*c*), polysilicon is filled into the recess in the memory cell hole, to form the fuse 103B. Further, in the step shown in FIG. 12(*d*), the current controlling element 112, the contact plug 117 and the second wire 119 are formed similarly to Embodiment 1. By the manufacturing method as described above, it is possible to easily implement the resistance variable semiconductor memory device 20 which performs a resistance changing operation stably.

Numerous modifications and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile memory element and a semiconductor memory device of the present invention are capable of a high-speed operation and have a stable rewrite characteristic and are useful as a nonvolatile memory element and a semiconductor memory device which are used with various electronic hardware such as digital home appliance, memory cards, portable cellular phones, personal computers, etc.

REFERENCES SIGNS LIST 10, 20 semiconductor memory device
11 nonvolatile memory element (memory cell)
100 substrate
101 first wire
102 first interlayer insulating layer
102B lower interlayer insulating layer
103 fuse (first contact plug)
103B fuse (second contact plug)
103*a* first polysilicon layer
103*b* second polysilicon layer
103*c* side walls
103*d* third polysilicon layer
104 photoresist etching mask
105 resistance variable element
106 lower electrode (first electrode) of resistance variable element
107 resistance variable layer
108 upper electrode (second electrode) of resistance variable element
109 second interlayer insulating layer
110 second contact plug
112 current controlling element
113 lower electrode (third electrode) of current controlling element
114 semiconductor layer
115 upper electrode (fourth electrode) of current controlling element
116 third interlayer insulating layer
116B upper interlayer insulating layer
117 third contact plug
118 fourth contact plug
119 second wire
120 lead-out wire

The invention claimed is:

1. A nonvolatile memory element comprising:
a current controlling element having a non-linear current-voltage characteristic;
a resistance variable element which changes reversibly between a low-resistance state and a high-resistance state in which a resistance value of the resistance variable element is higher than a resistance value of the resistance variable element in the low-resistance state, in response to voltage pulses applied; and
a fuse,
the current controlling element, the resistance variable element and the fuse being connected in series, and
the fuse being configured to be blown when the current controlling element is substantially short-circuited.

2. The nonvolatile memory element according to claim 1, wherein the current controlling element, the resistance variable element and the fuse are connected in series to each other at a three-dimensional cross-point at which a first wire crosses a second wire, to constitute a cross-point nonvolatile memory element.

3. The nonvolatile memory element according to claim 1, wherein the fuse has a resistance value lower than the resistance value of the resistance variable element in the low-resistance state.

4. The nonvolatile memory element according to claim 3, wherein the fuse has the resistance value of 5 kΩ or less.

5. The nonvolatile memory element according to claim 1, wherein the fuse comprises polysilicon.

6. The nonvolatile memory element according to claim 1, wherein the fuse comprises an element which is blown and fused when a current with a predetermined current value or more flows therethrough.

7. A semiconductor memory device comprising:
a substrate;

a plurality of first wires provided on the substrate to extend in parallel with each other;

a plurality of second wires provided above the plurality of first wires to extend in parallel with each other within a plane parallel to a main surface of the substrate and three-dimensionally cross the plurality of first wires; and a nonvolatile memory element array including a plurality of nonvolatile memory elements, wherein:

each of the plurality of nonvolatile memory elements comprises:
- a current controlling element having a non-linear current-voltage characteristic;
- a resistance variable element which changes reversibly between a low-resistance state and a high-resistance state in which a resistance value of the resistance variable element is higher than a resistance value of the resistance variable element in the low-resistance state, in response to voltage pulses applied; and
- a fuse, wherein:
  - the current controlling element, the resistance variable element and the fuse are connected in series, and
  - the fuse is configured to be blown when the current controlling element is substantially short-circuited, and the nonvolatile memory elements are provided to respectively correspond to three-dimensional cross-points of the plurality of first wires and the plurality of second wires and to connect the first wires to the second wires, respectively.

8. The semiconductor memory device according to claim 7, wherein:

the resistance variable element includes a first electrode, a second electrode and a resistance variable layer sandwiched between the first electrode and the second electrode, the current controlling element includes a third electrode, a fourth electrode, and an insulator layer or a semiconductor layer which is sandwiched between the third electrode and the fourth electrode, the nonvolatile memory element includes at least one of a contact plug provided between the first wire and the first electrode of the resistance variable element to electrically connect the first wire to the first electrode, a contact plug provided between the second electrode of the resistance variable element and the third electrode of the current controlling element to electrically connect the second electrode to the third electrode, and a contact plug provided between the fourth electrode of the current controlling element and the second wire to electrically connect the fourth electrode to the second wire, and the fuse is configured as one of the contact plugs.

9. The semiconductor memory device according to claim 7, wherein the fuse comprises an element which is blown and fused when a current with a predetermined current value or more flows therethrough.

* * * * *